June 18, 1957 H. A. RICHARDSON 2,796,523
CONTROL CIRCUITS FOR ELECTRIC OSCILLATORS
Filed Sept. 7, 1954
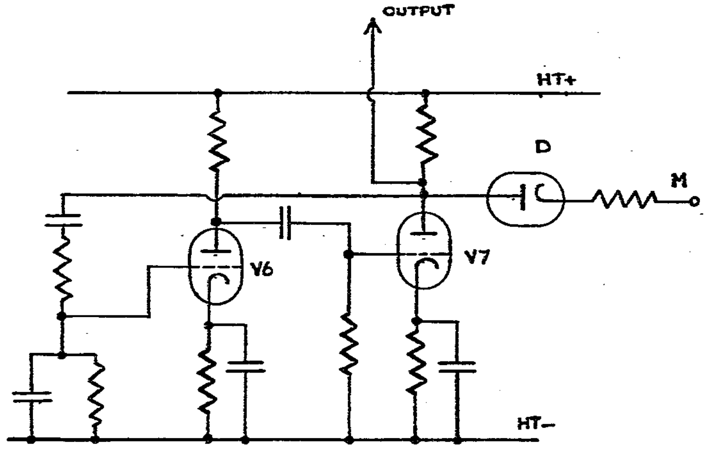
INVENTOR
Henry Arnold Richardson
By Morris & Bateman
ATTORNEYS United States Patent Office 2,796,523

Patented June 18, 1957

2,796,523

CONTROL CIRCUITS FOR ELECTRIC OSCILLATORS

Henry Arnold Richardson, Stretford, England, assignor to Metropolitan-Vickers Electrical Company Limited, London, England, a British company Application September 7, 1954, Serial No. 454,281

Claims priority, application Great Britain September 10, 1953

1 Claim. (Cl. 250—36)

This invention relates to control circuits for electronic oscillators and has an important application in modulating circuits.

Most oscillators when modulated tend to produce a large modulation frequency component which must be filtered out from the carrier. In cases in which the modulation frequency differs very much from the carrier, as for example, at broadcasting frequencies it is comparatively easy to filter out the modulation frequency component. In cases, however, in which the modulation frequency approaches the carrier frequency, i. e., where the ratio of the frequencies is of the order 1:20 or less, it becomes difficult and complicated to filter out the modulation frequency component.

The present invention comprises an electronic oscillator together with means for applying a control voltage through a rectifier to a control point of the oscillator so as to limit the voltage excursions of the oscillations in at least one direction in such a manner that the amplitude of the oscillations is a function of the control voltage.

The control point may be any point in the oscillator loop circuit where the oscillatory voltage at that point determines the oscillatory voltage at the output of the oscillator. This point may be the output point itself.

Such an arrangement may be employed for stabilising an oscillator output by applying a steady control voltage or it may be employed for amplitude modulating the oscillator output by applying a varying modulating voltage.

One way of explaining the mode of operation of the invention is to consider the loop gain of the oscillator. When the amplitude of the instantaneous oscillatory voltage at the control point reaches the requisite value relative to the control voltage, the rectifier will conduct. If the shunt effect of the rectifier is sufficient, the loop gain of the oscillator will be reduced to a value less than the minimum required to sustain that particular oscillation, which will then die down. This action will then repeat itself for each subsequent oscillation.

The rectifier may be arranged to conduct either on the positive excursion or the negative excursion or if desired during both positive and negative half-cycles.

In order that the invention may be more clearly understood reference will now be made to the accompanying drawings, in which the drawing is a circuit arrangement showing the invention applied to a Wien bridge oscillator.

In the drawing only those parts are shown which are essential for an understanding of the invention and well known and obvious connections are omitted.

The drawing shows the invention applied to a Wien bridge oscillator in which the oscillator is constituted by the valves V6 and V7 arranged in conventional fashion with the output taken from V7. In this case the modulating voltage is applied through the diode D to the anode of V7.

With this arrangement it will be appreciated that on the positive going excursions of the voltage oscillation at the anode of V7 the diode D will conduct and the amplitude of the oscillation will be limited thereby.

By feeding the modulating voltage into terminal M the anode voltage of V7 will vary. The envelope of the oscillations will follow the variations in the modulating voltage to a high degree of accuracy as the amplitude of the oscillation in the negative half swing is practically an image of the preceding positive half swing the component at modulation frequency is very small.

It follows that by reversing the rectifier the control action could be exerted on the negative half-cycles instead of on the positive half-cycles, and in this way produce the same result. It has been found that by modulating one half-cycle only the divergence from symmetry of the unmodulated half-cycle is, for most purposes, negligible. However, in cases in which this error cannot be tolerated, it is possible to modulate both half-cycles by applying two modulating voltages through oppositely connected diodes so as to exert a clamping action on both the positive and negative half-cycles of the oscillations.

What I claim as new and desire to secure by Letters Patent of the United States is:

In combination, an electronic oscillator containing a Wien bridge network, said network having an input and an output, an amplifier valve having an anode and a control grid, a connection from said output to the control grid of said amplifier valve, a phase reversal valve having an anode and a control grid, a connection from the anode of said amplifier valve to the control grid of said phase reversal valve and a connection from the anode of said phase reversal valve to the input to said network, a diode rectifying valve connected to the anode of said phase reversal valve, and means for applying a control voltage through said rectifying valve so as to limit the voltage excursions at the anode of said phase reversal valve in at least one direction and so control the amplitude of the oscillations.

References Cited in the file of this patent

UNITED STATES PATENTS

| | | |
|---|---|---|
| 2,474,261 | Leibe et al. | June 28, 1949 |
| 2,521,052 | Edwards | Sept. 5, 1950 |
| 2,523,051 | Norgaard | Sept. 19, 1950 |
| 2,543,030 | King | Feb. 27, 1951 |
| 2,568,868 | Pratt | Sept. 25, 1951 |
| 2,583,837 | Hadfield | Jan. 29, 1952 |